(12) United States Patent
Allred et al.

(10) Patent No.: US 9,576,184 B2
(45) Date of Patent: Feb. 21, 2017

(54) DETECTION OF A PERIMETER OF A REGION OF INTEREST IN A FLOOR PLAN DOCUMENT

(71) Applicant: Textura Planswift Corporation, Bountiful, UT (US)

(72) Inventors: Heber Allred, Apple Valley, UT (US); Robert Richter, Colorado City, AZ (US)

(73) Assignee: TEXTURA PLANSWIFT CORPORATION, Bountiful, UT (US)

( * ) Notice: Subject to any disclaimer, the term of this patent is extended or adjusted under 35 U.S.C. 154(b) by 186 days.

(21) Appl. No.: 14/471,775

(22) Filed: Aug. 28, 2014

(65) Prior Publication Data

US 2016/0063722 A1    Mar. 3, 2016

(51) Int. Cl.
| | | |
|---|---|---|
| G09G 5/00 | (2006.01) |
| G06K 9/00 | (2006.01) |
| G06T 11/20 | (2006.01) |
| G06F 17/30 | (2006.01) |
| G06F 17/50 | (2006.01) |
| G06K 9/32 | (2006.01) |

(52) U.S. Cl.
CPC ......... G06K 9/00201 (2013.01); G06F 17/30 (2013.01); G06F 17/50 (2013.01); G06T 11/203 (2013.01); *G06K 9/00476* (2013.01); *G06K 9/3233* (2013.01); *G06T 2210/04* (2013.01)

(58) Field of Classification Search
None
See application file for complete search history.

(56) References Cited

U.S. PATENT DOCUMENTS

| | | | |
|---|---|---|---|
| 5,553,214 A | * | 9/1996 | Marks ............... G06T 11/00 345/441 |
| 5,907,850 A | | 5/1999 | Krause et al. |
| 7,484,183 B2 | | 1/2009 | Look et al. |
| 7,629,985 B2 | | 12/2009 | McArdle et al. |

(Continued)

FOREIGN PATENT DOCUMENTS

JP    2002342388 A    11/2002

OTHER PUBLICATIONS

"2012 SolidWorks Help—Measure", Dassault Systemes, 2 pages, web page help.solidworks.com/2012/English/solidworks/sldworks/hidd_measure.htm, 2012.

*Primary Examiner* — Anh-Tuan V Nguyen

(57) ABSTRACT

A method of defining a region of interest in a floor plan document including identifying a point within the region of interest, identifying notations in the floor plan document potentially indicative of walls near the identified point, and identifying notations in the floor plan document potentially indicative of protrusions from the walls near the identified point. The method also includes determining whether the notations potentially indicative of protrusions from the walls are part of the perimeter of the region of interest based on at least one criteria selected from a group consisting of size, shape, and location of the notation potentially indicative of a protrusion, defining the perimeter of the region of interest based on the notations determined to be part of the perimeter of the region of interest, and calculating a quantity associated with the region of interest based on the defined perimeter of the region of interest.

23 Claims, 12 Drawing Sheets

(56) References Cited

U.S. PATENT DOCUMENTS

| | | | |
|---|---|---|---|
| 2003/0122852 A1* | 7/2003 | Susnjara | G06F 17/5004 345/653 |
| 2003/0233625 A1* | 12/2003 | Brazell | G06F 17/5068 716/119 |
| 2005/0063592 A1* | 3/2005 | Li | G06K 9/222 382/181 |
| 2005/0138587 A1* | 6/2005 | Naum | G06F 17/5072 716/111 |
| 2006/0110008 A1* | 5/2006 | Vertegaal | G06K 9/00604 382/103 |
| 2009/0046931 A1* | 2/2009 | Xiao | G06K 9/38 382/180 |
| 2010/0122208 A1* | 5/2010 | Herr | G06F 3/04845 715/799 |
| 2013/0024797 A1* | 1/2013 | Faulkner | G06F 17/5004 715/771 |
| 2013/0031521 A1* | 1/2013 | Teoh | G06F 17/5081 716/111 |
| 2013/0202157 A1* | 8/2013 | Pershing | G01B 21/28 382/106 |
| 2014/0032179 A1* | 1/2014 | Solihin | G06F 17/509 703/1 |
| 2014/0153789 A1* | 6/2014 | Sharma | G06K 9/00476 382/113 |
| 2014/0278268 A1* | 9/2014 | Woolsey | G06F 17/5004 703/1 |
| 2014/0328540 A1* | 11/2014 | Wang | G06K 9/00476 382/173 |
| 2015/0161300 A1* | 6/2015 | Hopper | G06T 17/005 703/1 |
| 2016/0055268 A1* | 2/2016 | Bell | G06F 17/5004 703/1 |

* cited by examiner

DETECTION OF A PERIMETER OF A REGION OF INTEREST IN A FLOOR PLAN DOCUMENT

BACKGROUND

Designing, remodeling, and constructing new buildings or homes requires knowledge of various details such as area to be constructed, materials needed, applicable budgets, and the like. Conventional systems aid a user, be it a property owner, an architect, or a contractor, to determine the linear and area units of measurement (imperial and metric) to ultimately determine amount of materials (and/or time) they may need to complete a specific project. However, to provide the necessary information conventional systems require that the user precisely identify an area within a construction document (e.g., a floor plan, an elevation plan, and the like) to be analyzed. Often, the only tool available to identify a specific area is a drawing, a markup, or takeoff tool (e.g., ruler, highlighter pencil, or scale wheel if manual; mouse clicks on the corner points of a perimeter if using a software/takeoff program). Depending on the specific area, using a drawing tool (or takeoff tool) and defining the region of interest by hand can be particularly tedious and prone to error. Such systems require that the user manually and carefully define the area around objects within the room. Defining an area manually is not only tedious (e.g., due to the large number of clicks necessary), but it is also time-consuming. In some instances it may be easier to do the analysis by paper using simple schematics, rather than using a system that requires extensive user input. If the analysis is done manually on paper, rather than on an electronic construction document, the calculations will be much more prone to human and calculation error. A mistake in obtaining the right amount of materials or estimating the cost of completing a project can be significant depending on the specific application.

SUMMARY

In one embodiment, the invention provides a method of defining a region of interest in a construction document. The method includes accessing a stored construction document from a non-transient computer-readable memory, displaying at least a portion of the construction document on a display, and receiving an input from a user. The input from the user identifies a point within the region of interest. The method further includes identifying one or more notations in the construction document potentially indicative of boundaries near the identified point and identifying one or more notations in the construction document potentially indicative of protrusions from the boundaries near the identified point. The method also includes determining whether the one or more notations potentially indicative of boundaries are part of a perimeter of the region of interest, and determining whether the one or more notations potentially indicative of protrusions from the boundaries are part of the perimeter of the region of interest based on at least one criteria selected from a group consisting of size, shape, and location of the notation potentially indicative of a protrusion. The method further includes defining the perimeter of the region of interest based on the notations determined to be part of the perimeter of the region of interest, and calculating, by a processor, a quantity associated with the region of interest based on the defined perimeter of the region of interest.

In another embodiment the invention provides a method of defining a region of interest in a construction document. The method includes accessing a stored construction document from a non-transient computer-readable memory, displaying at least a portion of the construction document on a display, and receiving an input from a user. The input from the user identifies a point within the region of interest. The method also includes identifying a closed outline in the construction document surrounding the identified point within the region of interest and identifying a plurality of uniform contours each forming at least part of the closed outline. However, in some constructions, the method identifies a closed outline formed by both existing lines in the original document and user created boundaries (e.g., boundary lines added by the user across open doorways in a floor plan document). Each uniform contour being potentially indicative of a boundary in the construction document. The method also includes identifying a protrusion from one of the plurality of uniform contours. The protrusion forms a part of the closed outline in the construction document. The method further includes determining whether the protrusion forms part of a perimeter of the region of interest, and defining the perimeter of the region of interest. The perimeter of the region of interest includes the uniform contour and omits the identified protrusion when it is determined that the identified protrusion does not form part of the perimeter of the region of interest. The perimeter of the region of interest includes the identified protrusion and only part of the uniform contour included in the closed outline when it is determined that the identified protrusion forms part of the perimeter of the region of interest.

Other aspects of the invention will become apparent by consideration of the detailed description and accompanying drawings.

DETAILED DESCRIPTION

Figure 1:
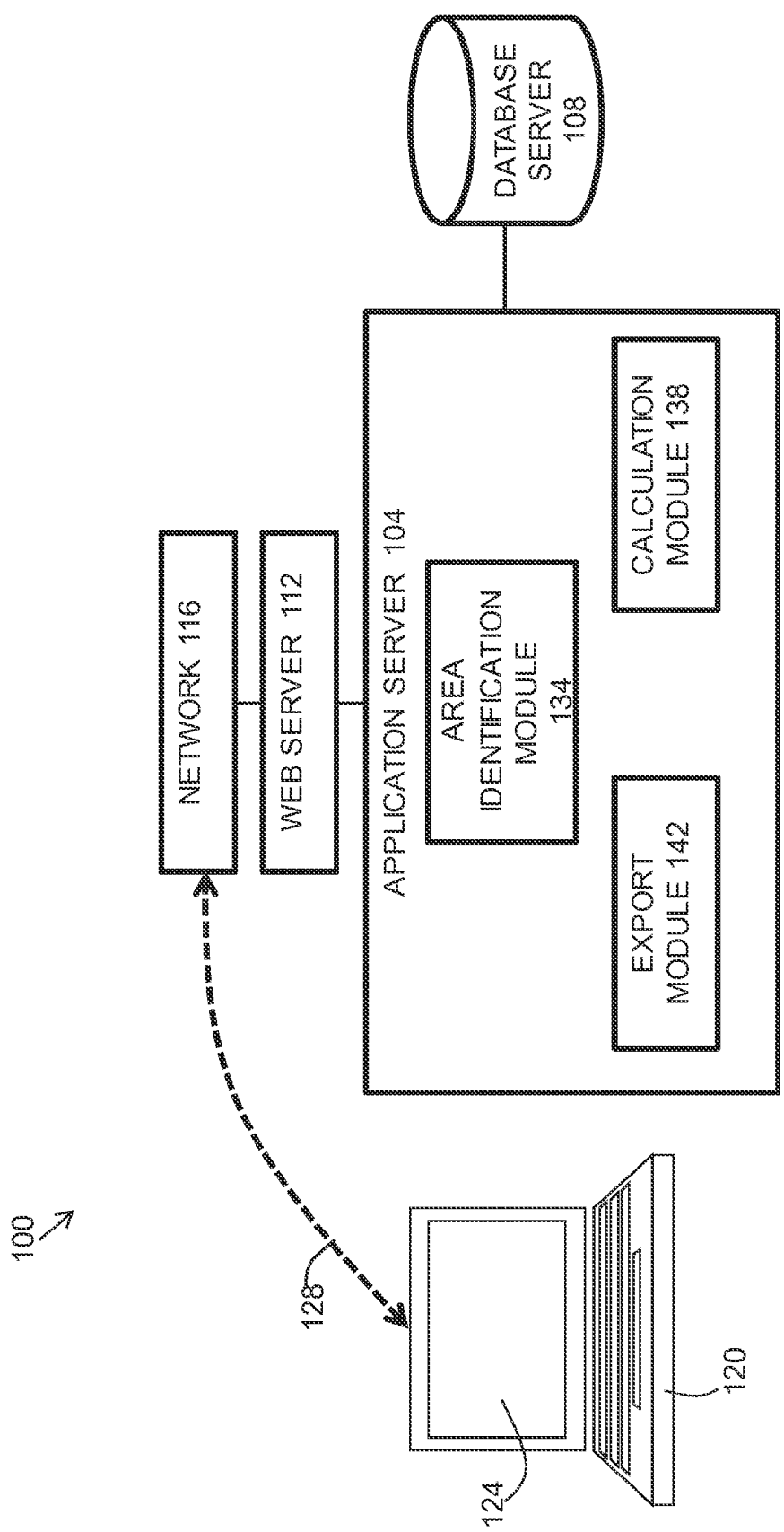
FIG. 1 is a schematic illustration of an architectural system according to one embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limited. The use of "including," "comprising" or "having" and variations thereof herein is meant to encompass the items listed thereafter and equivalents thereof as well as additional items. The terms "mounted," "connected" and "coupled" are used broadly and encompass both direct and indirect mounting, connecting, and coupling. Further, "connected" and "coupled" are not restricted to physical or mechanical connections or couplings, and can include electrical connections or couplings, whether direct or indirect. Also, electronic communications and notifications may be performed using any known means including direct connections, wireless connections, etc.

It should be noted that a plurality of hardware and software based devices, as well as a plurality of different structural components may be utilized to implement the invention. Furthermore, and as described in subsequent paragraphs, the specific configurations illustrated in the drawings are intended to exemplify embodiments of the invention and that other alternative configurations are possible.

FIG. 1 illustrates an architectural calculation system 100 according to one embodiment of the invention. The architectural system 100 can be used to provide calculations to help contractors, architects, designers, property owners, and the like to design and construct buildings. The architectural system 100 can be used to access detailed construction documents, obtain meaningful calculations from the construction documents relating specifically to the building construction, and export calculations to a separate document for further analysis.

Figure 1A:
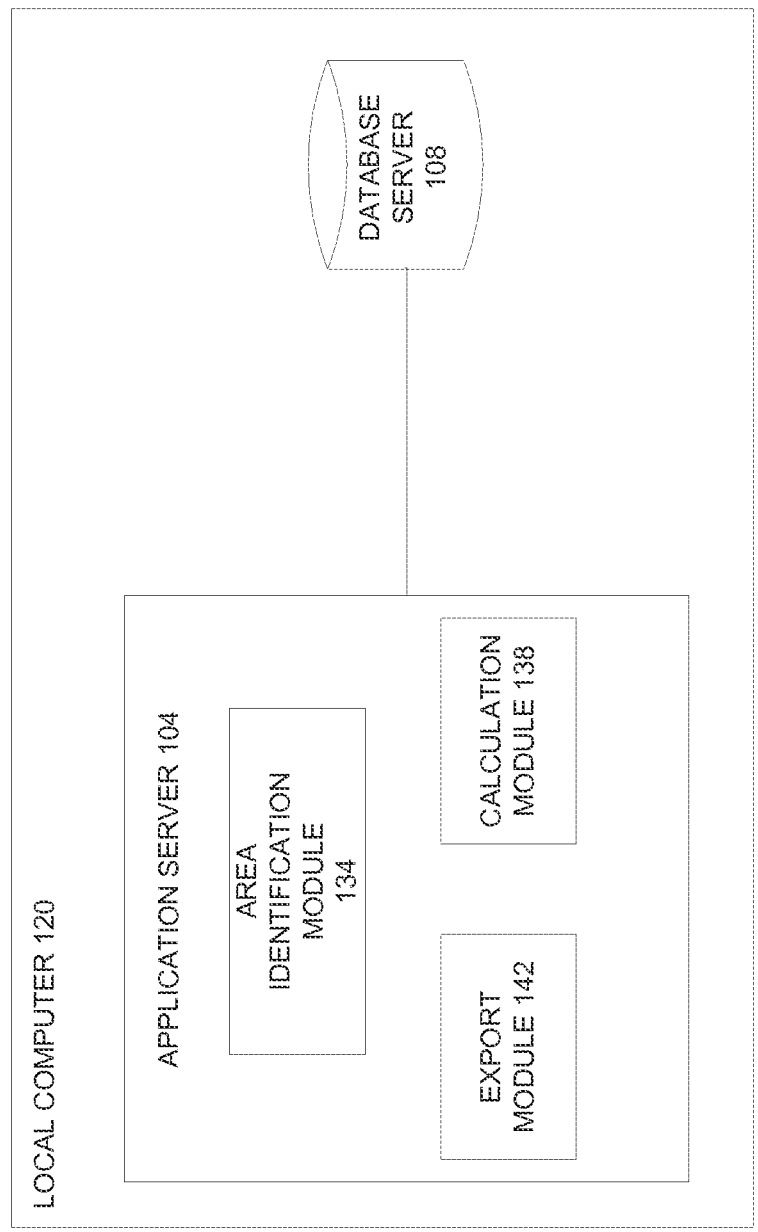
FIG. 1A is a schematic illustration of an architectural system according to a second example of the invention.

The architectural system 100 can include an application server 104, a database server 108, a web server 112, and a network 116 (such as the Internet or other networks individually or in combination with the Internet). A local computer 120 used to access the architectural system 100 includes a processor, a display, and an input control. The local computer 120 is used to generate a graphical user interface 124 according to the architectural system 100, display the graphical user interface 124 on the display, and receive user input through the input control. As shown in FIG. 1 by link 128, the local computer 120 connects to the network 116 to gain access to the application server 104 and the database server 108. In some embodiments, several local computers 120 can access the application server 104 and the database server 108 through the network 116 using a password pair to gain access to the application server 104 and to the database server 108. In other embodiments, as shown in FIG. 1A, the local computer 120 also hosts the application server 104 and the database server 108. In such embodiments, the local computer 120 can be used directly to access the application server 104 and the database server 108. In such embodiments, the database server 108 may refer to memory in the local computer 120.

The application server 104 includes modules that allow a user to analyze construction documents. The database server 108 includes non-transient computer-readable memory that stores documents used by the architectural system 100. The documents stored in the database server 108 are of a particular format, for example, Tagged Image file (TIF*). In some embodiments, the database server 108 also stores documents of different formats instead of, or in addition to, a particular format. For example, the database server 108 may additionally store documents with a Portable Document Format (PDF) or Joint Photographic Experts Group (JPEG) format.

In the illustrated embodiment, the architectural system 100 can be used to access construction document 132. The construction document 132 may be a floor plan, a roof plan, an elevation plan, a photograph, a satellite image (i.e., when used for construction planning purposes), ceiling plans, site plans, or a different document used to help in construction planning. The construction document 132 is an electronic graphical construction document. In other words, the construction document 132 is a graphic representation of the arrangement of structures that are part of a development or building project. The structures, as described above, may be buildings, parking, drives, sewer/water lines, lighting, walls, furniture, landscaping and garden elements, and the like. In some instances, the construction document 132 may also be referred to as an architectural plan, an architectural rendering, a residential/commercial construction plan, a civil drawing, a cross-section, an electrical drawing, a floor plan, a house plan, a mechanical systems drawing, a plan, a plumbing drawing, a site plan, a structural drawing, a 3-D floor plan, a BIM model, an assembly modeling, an architectural scheme, a blueprint, a floor design, a floor draft, and other similar terms. The application server 104 accesses the imported construction document 132 from a non-transitory computer-readable memory and analyzes the construction document 132.

Figure 2:
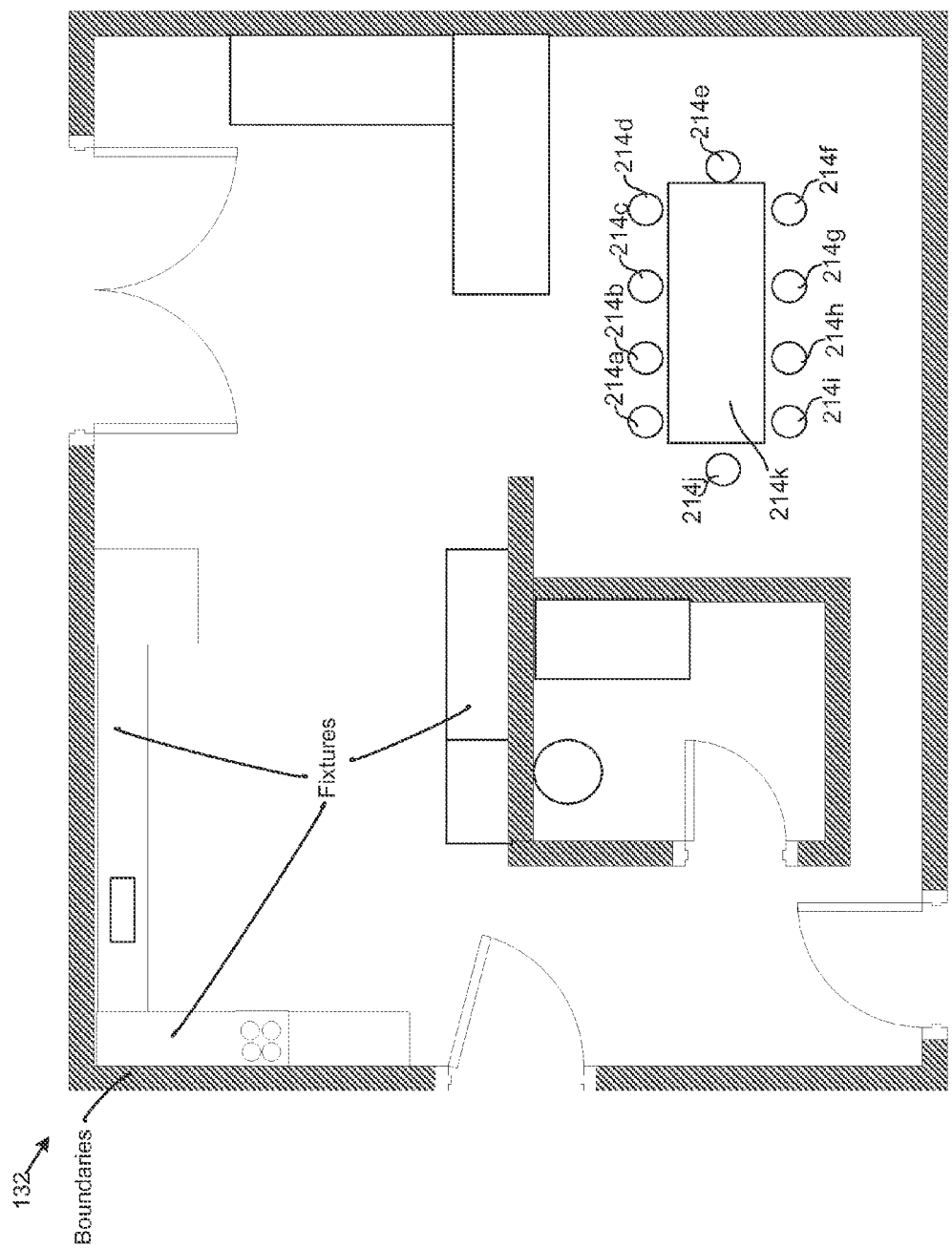
FIG. 2 is a construction floor plan displayed with the architectural system.

As shown in FIG. 2, the construction document 132 illustrates a construction layout for a particular building or floor of a building. In other embodiments, the construction document 132 illustrates construction layout for a roof, a parking lot, and the like. A user can access (e.g., import from a different file) the construction document 132 using the local computer 120 and the graphical user interface 124. In general, the construction document 132 includes several notations indicative of information about rooms or structures included in a specific site plan or floor of a building. For example, some notations on the construction document 132 are indicative of boundaries for each area (e.g., walls in a room), other notations on the construction document 132 are indicative of fixtures, furniture, shrubbery, a driveway, or other objects planned to be installed in each area, and yet other notations are indicative of doors and swing lines corresponding to the opening direction of the doors and/or fences, text, symbols, and the like. Other notations indicative of other features, not explicitly discussed above, may also be included in the construction document 132.

The architectural system 100, and more specifically the application server 104, analyzes the construction document 132 to obtain useful information for the construction of a particular building. For example, through the application server 104, users can obtain information such as an area (e.g., square footage/square meters) of a particular area (e.g., a room), as well as the linear distance of the perimeter/border, number of corners, and ultimately determine labor required to build the room/building/structure, count of materials needed to build the room, and the like. For example, in a construction document including plans for a home (as shown in FIG. 2), users can select a specific region of interest (e.g., a specific room), and request calculations for that specific room (e.g., area, linear perimeter, and the like). The region of interest may be a specific room in a floor plan, a side of a roof in a roof plan, a portion of a wall on an elevation plan, a garden area in a landscape plan, etc. In some embodiments, the architectural system 100 (e.g., the application server 104) can also use additional information (e.g., cost of specific materials) to provide the user with, for example, estimates of cost. The architectural system 100 may obtain the additional information through user input, or by accessing a program, a database, or a webpage. Calculations obtained through the architectural system 100 enable the users to efficiently make design changes, obtain construction materials, and provide estimates of cost.

To analyze and provide meaningful calculations, the application server 104 first defines a perimeter of a region of interest (e.g., a particular area within the construction document 132) and then uses the defined perimeter to calculate a quantity associated with the region of interest. The application server 104 stores and provides access to an area identification module 134 that defines the perimeter of the region of interest, a calculation module 138 that calculates a quantity associated with the area of interest, and an export module 142 that exports the quantities associated with the area of interest to a separate document.

The area identification module 134 defines the perimeter associated with a particular region of interest (e.g., a particular area) within the construction document 132. The area identification module 134 receives an input from the user that identifies a point within a region of interest (e.g., a particular area). The area identification module 134 then automatically defines a perimeter of the region of interest to be used by the calculation module 138 based on the identified point. The particular point identified by the user can be anywhere within the region of interest. To define the perimeter of the region of interest, the area identification module 134 identifies notations on the construction document 132 that are potentially indicative of boundaries of the region of interest (e.g., walls of a room) and identifies notations on the construction document 132 that are potentially indicative of protrusions representing, for example, fixtures, furniture, doors, windows, building structures, shrubbery, electrical wiring, annotations, a project legend, symbols, or other objects. In some embodiments, some notations can be both potentially indicative of protrusions and potentially indicative of boundaries. Then, the area identification module 134 differentiates between the notations on the construction document 132 that are indicative of area boundaries and the notations on the construction document 132 that are indicative of protrusions and defines the perimeter of the region of interest based on the classification of the notations in the construction document 132.

Figure 3:
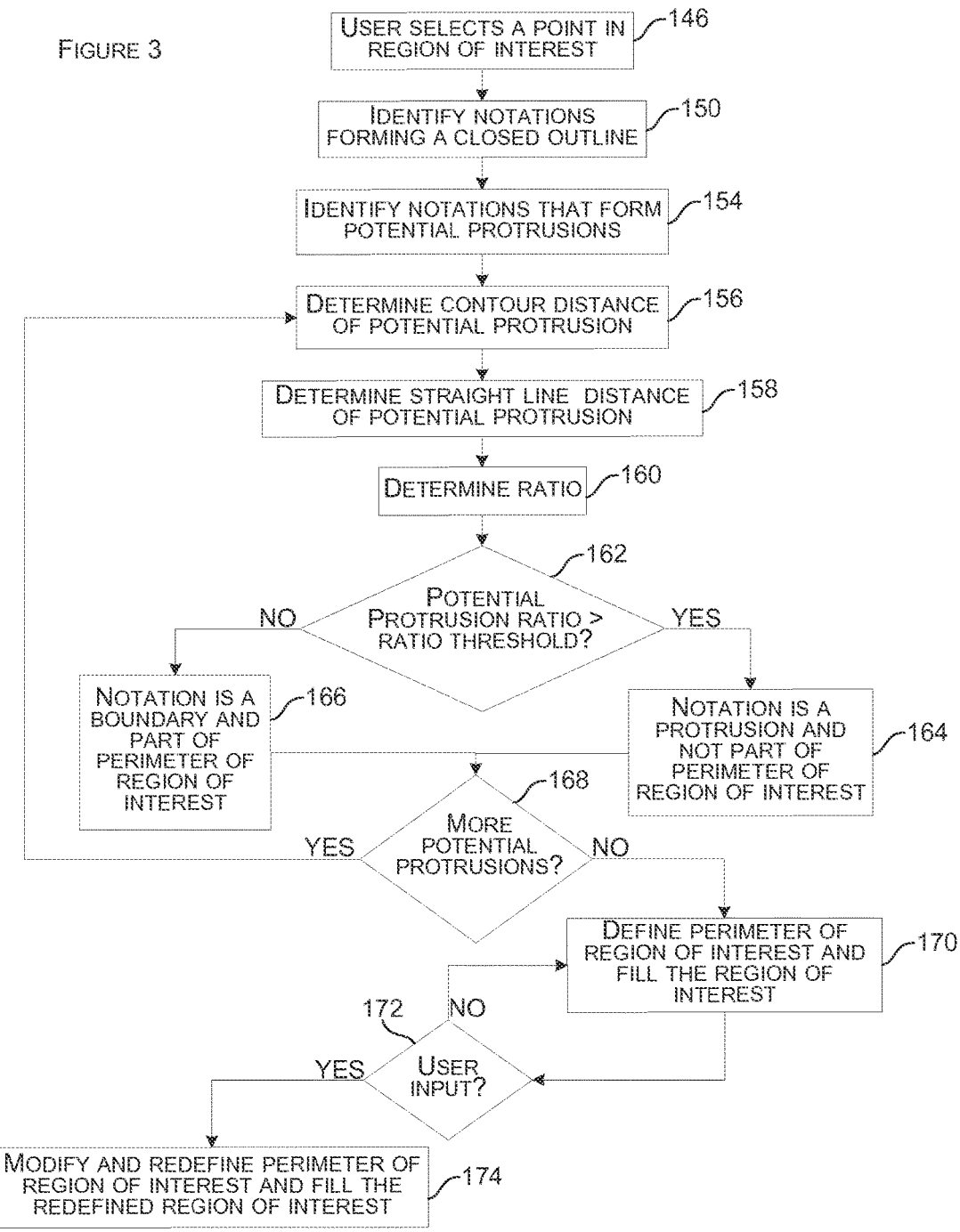
FIG. 3 is a flowchart illustrating a method of defining a perimeter of a region of interest.

FIG. 3 illustrates a first method implemented by the area identification module 134 to define the perimeter of the region of interest. The area identification module 134 first receives an input from a user identifying a point A (see FIG. 4) within the region of interest (block 146). The area identification module 134 then identifies notations within the construction document 132 that form a closed outline 194 surrounding the user-identified point (block 150). The area identification module 134 does not display the closed outline 194 to the user, but rather uses the closed outline 194 to help define the perimeter of the region of interest. In some embodiments, the closed outline 194 is formed using the least number of notations together to form the closed outline 194. In other embodiments, the closed outline 194 is formed using the notations that make the closed outline 194 bigger, in reference to other potential closed outlines. In the illustrated embodiment, the closed outline 194 is formed using the notations that make the closed outline 194 smaller with respect to other potential closed outlines. The area identification module 134 identifies the closed outline 194 by identifying notations that connect together to form the closed outline around the identified point A within the region of interest. In some embodiments, smooth curves are simplified by the area identification module 134 as a series of small straight lines joined at an angle. The notations forming the closed outline 194 are potentially indicative of boundaries (e.g., walls).

After identifying the closed outline 194, the area identification module 134 identifies notations within the region of interest that are potentially indicative of protrusions (block 154). In some embodiments the notations potentially indicative of protrusions are classified from the notations forming the closed outline 194. In some embodiments, such as the illustrated embodiment, the area identification module 134 traces around the identified closed outline and identifies notations that are potentially indicative of protrusions by identifying notations or sets of notations that extend at an angle from a connecting straight line.

Figure 4:
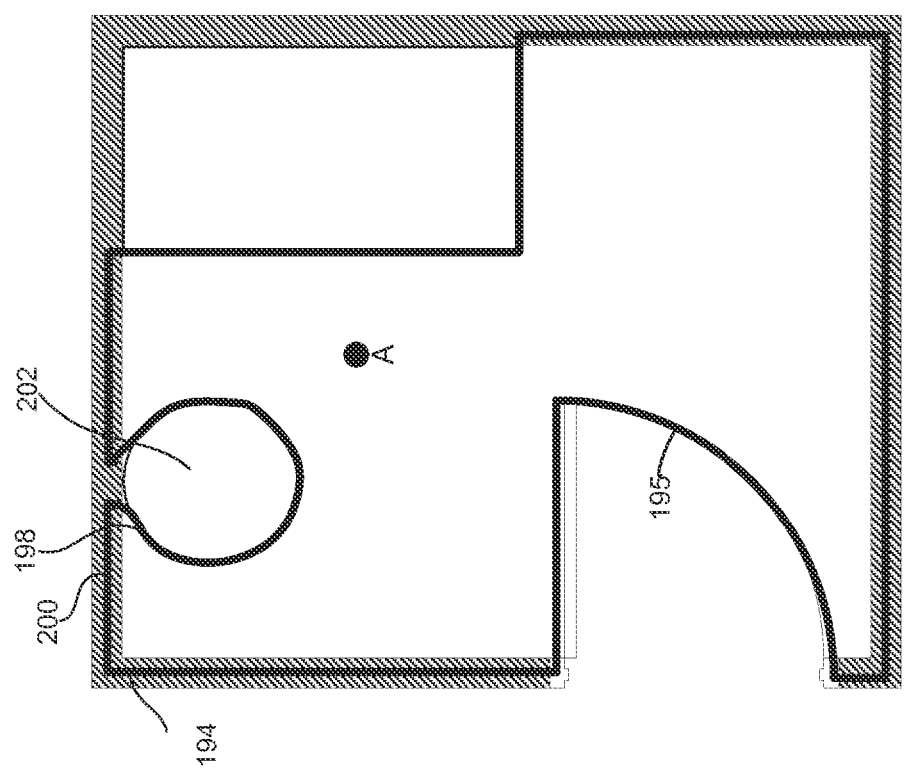
FIG. 4 is a partial view of the construction floor plan of FIG. 2 with a closed outline identified in response to a user input according to the method of FIG. 3.

For example, as shown in FIG. 4, the area identification module 134 identifies a first notation 198 that extends at an angle from a first connecting line 200. The first notation 198 forms a first potential protrusion 202. In some embodiments, such as the illustrated embodiment, the area identification module 134 only identifies notations forming a potential protrusion toward the inside of the identified closed outline 194. In other words, in some embodiments, the area identification module 134 only identifies potential protrusions that are closer to the identified point A than the rest of the closed outline 194. In some embodiments, the area identification module 134 identifies the swing line 195 as forming a second potential protrusion 203 because the swing line also extends at an angle from a straight connecting line. In other embodiments, the area identification module 134, however, does not identify the swing line 195 as forming the second protrusion 203, and simply analyzes the first potential protrusion 202.

The area identification module 134 then determines whether the notations identified as potential protrusions (e.g., first notation 198) represent a protrusion or a boundary of the region of interest. The method shown in FIG. 3, evaluates the potential protrusions (e.g., potential protrusion 202) based on a ratio of a contour distance associated with the potential protrusion (i.e., the line forming the outer boundary of the potential protrusion) to a straight line distance also associated with the potential protrusion (i.e., the straight line connecting two points of the closed contour if the potential protrusion were removed from the identified closed contour).

Therefore, after identifying the notations potentially indicative of boundaries of the region of interest and the notations potentially indicative of protrusions, the area identification module 134 determines the contour distance CD of each potential protrusion (block 156) and determines the straight line distance SLD bypassing the notations indicative of the potential protrusion (block 158). The area identification module 134 then calculates a ratio of the contour distance to the straight line distance specific for each potential protrusion (block 160) and compares the calculated ratio to a ratio threshold (block 162). If the ratio associated with the potential protrusion exceeds the ratio threshold (i.e., is above, is greater than), the area identification module 134 determines that the notations associated with the potential protrusion are indeed indicative of a protrusion and therefore, not part of the perimeter of the region of interest (block 164). If, on the other hand, the ratio associated with the potential protrusion is below (e.g., does not exceed, is less than) the ratio threshold, the area identification module 134 determines that the notations associated with the potential protrusion are indicative of boundaries of the region of interest and part of the perimeter of the region of interest (block 166). Typically, to be useful and structurally sound, boundaries have relatively low contour distance to straight line distance ratio. Therefore, analyzing the ratio of contour distance to straight line distance allows the area identification module 134 to make a realistic determination of which notations are indicative of boundaries and which notations are indicative of protrusions. The area identification module 134 then determines if there are other notations potentially indicative of protrusions (e.g., more potential protrusions) within the region of interest in the construction document 132 (block 168). If there is more than one potential protrusion, the room identification module 134 evaluates the next potential protrusion according to the ratio of contour distance to straight line distance as described above (blocks 156-166).

Referring again to FIG. 4 to provide a representative example, the area identification module 134 first analyzes, for example, the first potential protrusion 202. For the purpose only of providing a representative example, representative numbers are assigned to the contour distances, straight line distances, and the ratio threshold discussed above. In the illustrated example, the first potential protrusion 202 has a contour distance CD of approximately 8 units. However, the straight line distance SLD bypassing the first potential protrusion 202 is only about 1 unit. Therefore, the ratio of the contour distance to the straight line distance is 8 units. In the illustrated embodiment, the ratio threshold is about 2 units. Since the ratio associated with the first potential protrusion exceeds the ratio threshold, the notation 198 associated with the first potential protrusion 202 are determined to be indicative of a protrusion and not included as part of the perimeter of the region of interest. Therefore, the first potential protrusion is shaded in FIG. 5 as part of the total area enclosed by the identified perimeter of the room 216.

In embodiments in which the area identification module 134 also identifies the swing line 195 as the second potential protrusion 203, the area identification module 134 proceeds to determine whether the swing line 195 is indicative of a boundary or a protrusion. In the illustrated example, the swing line 195 has a contour distance DC of 11 units. The straight line distance SLD bypassing the swing line 195, however, is 6 units. Therefore, the area identification module 134 calculates a ratio of approximately 1.8 units, which is below the ratio threshold of 2 units. The swing line 195, therefore, is determined to be indicative of a boundary and part of the perimeter of the region of interest.

Once all the notations potentially indicative of protrusions are evaluated and determined either to be a boundary and part of the perimeter of the region of interest or a protrusion and not part of the perimeter of the region of interest, the area identification module 134 defines the perimeter of the region of interest based on the notations that were determined to be indicative of boundaries (block 170). The automatically defined perimeter 216 of the region of interest is then displayed to a user. The architecture system 100 shows the user what the area identification module 134 has defined as the region of interest by filling with a shade of color, or a filling pattern (see FIG. 5), the area defined by the region of interest (block 170).

Figure 5:
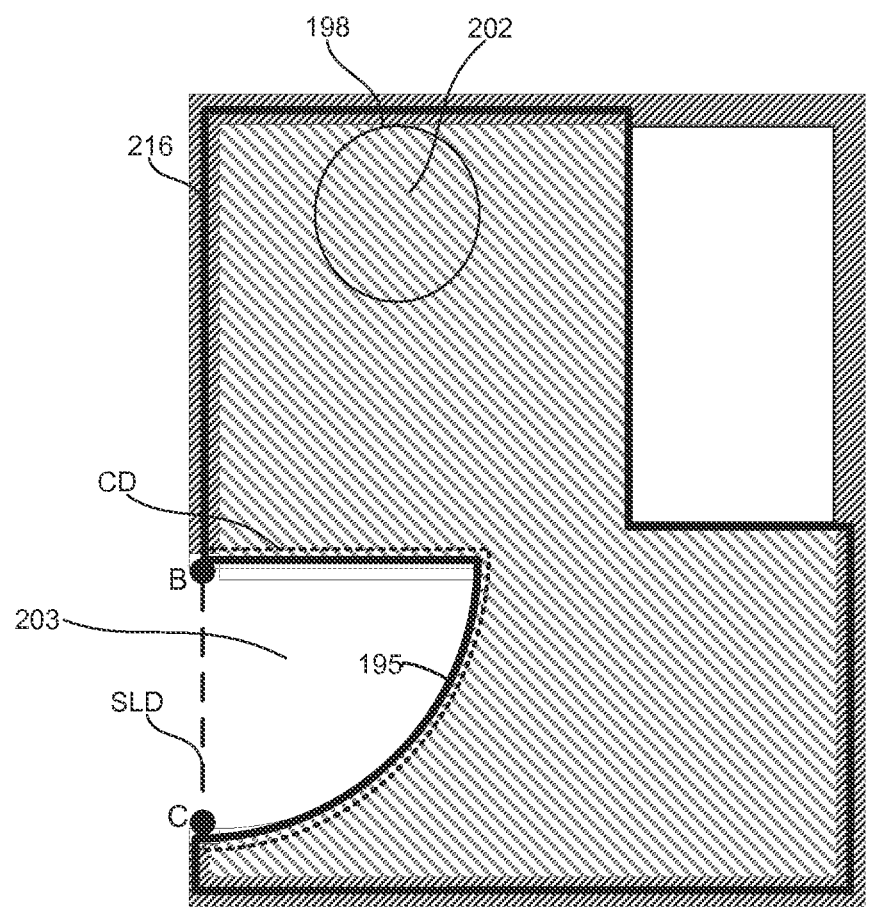
FIG. 5 is the partial view of FIG. 4 with an initial perimeter of the room identified according to the method of FIG. 3.

For example, referring to FIG. 5, the area identification module 134 displays the identified region of interest by filling the region of interest with a filling pattern and displaying an outline showing the automatically defined perimeter 216. According to FIG. 5, and as explained above, the first notation 198 is indicative of a protrusion and does not form part of the perimeter of the region of interest (i.e., the first potential protrusion 202 is shaded), while the swing line 195 is indicative of a boundary and forms part of the perimeter of the region of interest (i.e., the second potential protrusion 203 is not shaded).

Once the area identification module 134 displays the automatically defined perimeter 216 to the user, the area identification module 134 checks if any user input is received to modify the perimeter of the region of interest (blocks 172). If the area identification module 134 receives any user input to modify the perimeter of the region of interest, the area identification module 134 modifies the perimeter of the region of interest and fills with a shade of color or a filling pattern the region of interest as redefined by the user (blocks 174).

Figure 6:
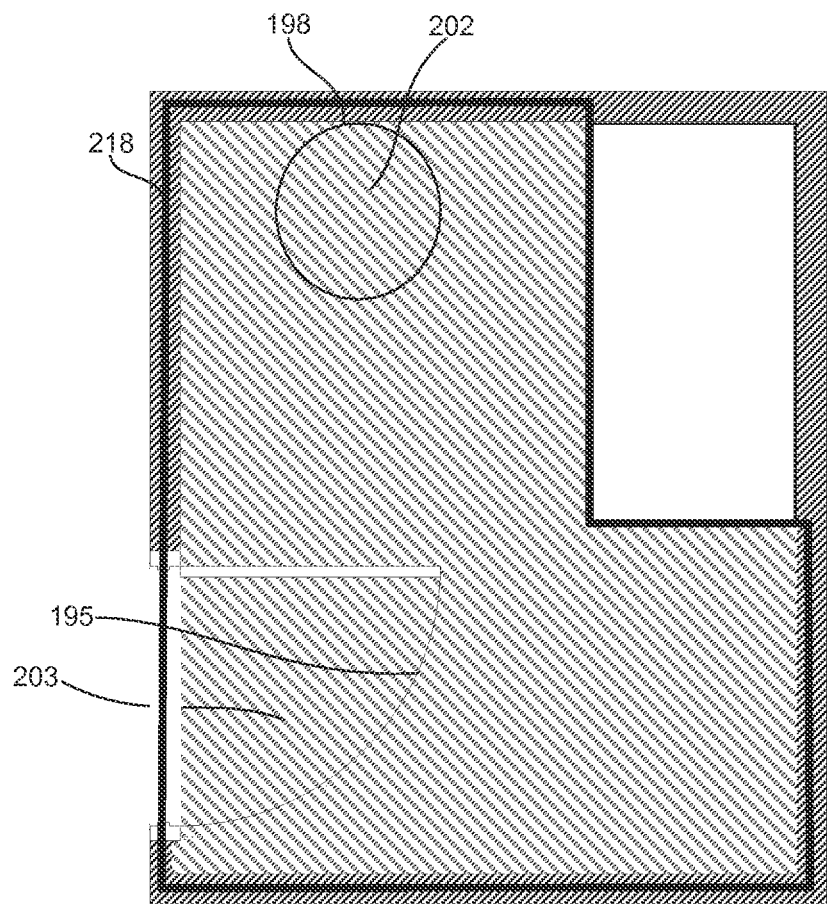
FIG. 6 is the partial view of FIG. 4 with an updated perimeter of the room identified according to the method of FIG. 3.

Different user inputs may modify the perimeter of the region of interest differently. For example, as shown in FIG. 5, the swing line 195 was determined by the area identification module 134 to be indicative of a boundary. However, the area excluded by the swing line 195 is also part of the region of interest (e.g., part of the same room). The user, therefore, adjusts the automatically defined perimeter 216. In the illustrated embodiment, the user modifies the automatically defined perimeter 216 by selecting a first point B near one end of the swing line 195 and forming a line connecting the first point B to a second point C near the opposite end of the swing line 195. The area identification module 134 then automatically identifies that the notation created by the user (e.g., the line between point B and point C) is indicative of a boundary and redefines the perimeter of the region of interest as shown in FIG. 6 (e.g., a first modified perimeter 218). In some embodiments, a user may add notations to the construction document 132 before the area identification module 134 identifies the perimeter for the region of interest or before the user selects the point A within the region of interest. In such embodiments, the area identification module 134 takes into consideration the notations added by the user when defining the perimeter for the region of interest.

Figure 7:
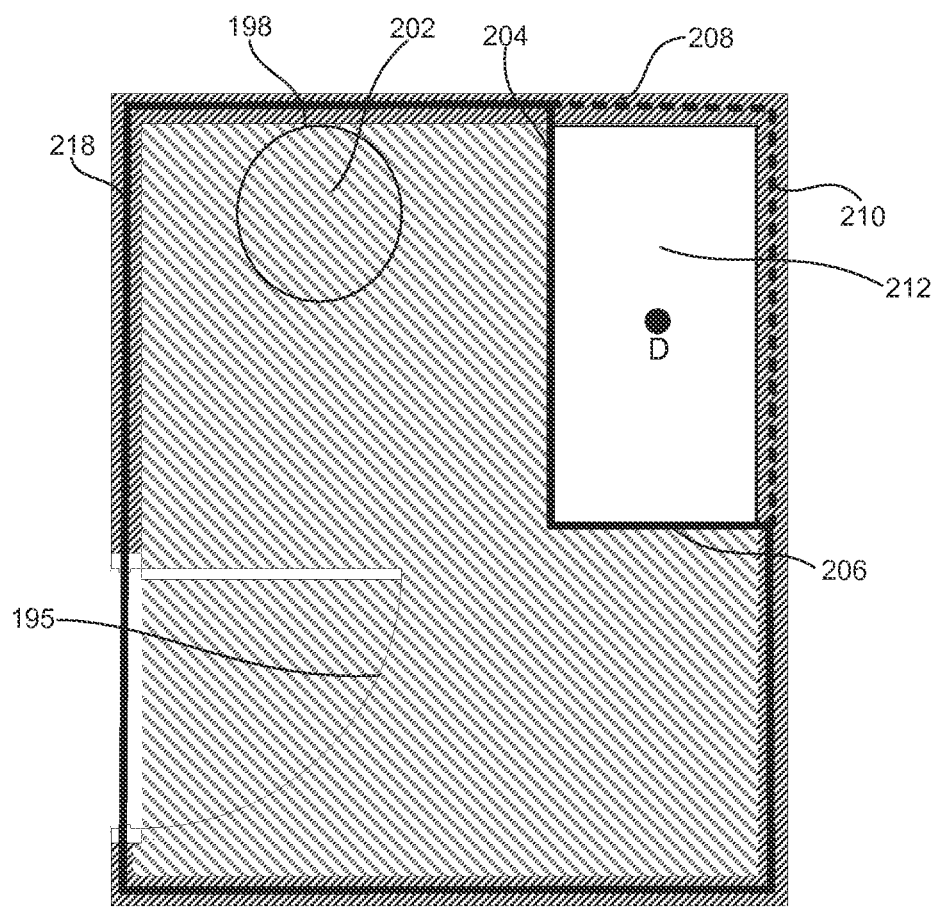
FIG. 7 is the partial view of FIG. 4 with the perimeter of the room updated in response to a user input according to the method of FIG. 3.
Figure 8:
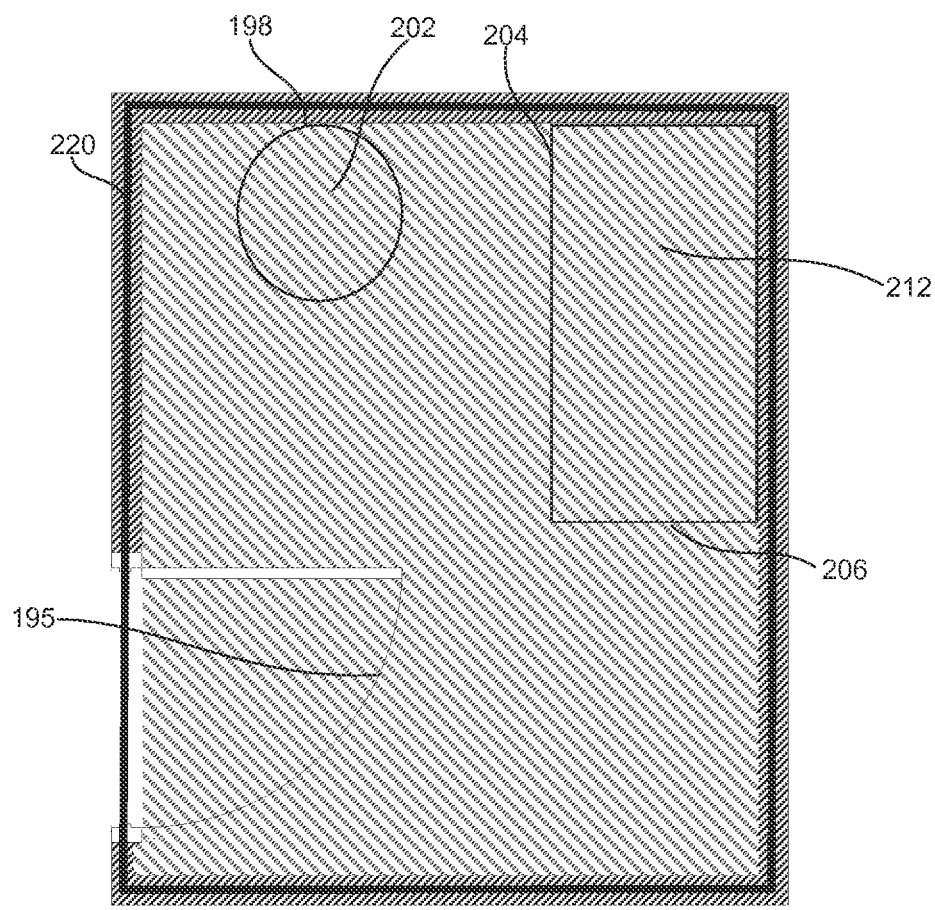
FIG. 8 is the partial view of FIG. 4 with the perimeter of the room further updated in response to another user input according to the method of FIG. 3.

The user can also modify the automatically defined perimeter 216 by selecting a point D within a different enclosed area (see FIG. 7) adjacent the defined region of interest. For example, the area identification module 134 may incorrectly identify a second notation 204 and a third notation 206 to be indicative of boundaries, when instead the second and third notations 204, 206 are simply indicative of a protrusion and a second connecting line 208 and a third connecting line 210 are actually indicative of the boundaries of the region of interest. In such cases, a user may select a point (e.g., point D) within the area between the second and third notations 204, 206 and the second and third connecting lines 208, 210. When the area identification module 134 receives the user input identifying point D, the area identification module 134 redefines the automatically defined perimeter 216 and defines a second modified perimeter 220, as shown in FIG. 8. Note that the modified perimeter 220 shown in FIG. 8 is different than the modified perimeter 218 previously mentioned since different types of user inputs were received by the area identification module 134 to modify the automatically defined perimeter 216.

In other embodiments, the area identification module 134 may implement a different method to determine which notations are indicative of protrusions and which notations are indicative of boundaries of the region of interest. For example, according to the method illustrated in FIG. 9, the area identification module 134 still receives a user input selecting the point A within the region of interest and identifies notations that form a closed outline 194' around the point A (i.e., notations potentially indicative of boundaries), as shown by blocks 300 and 302, respectively. As shown in FIG. 10, the closed outline 194' identified using the method of FIG. 9 may be different than the closed outline 194 identified using the method shown in FIG. 3. Similar to the closed outline 194, the closed outline 194' is not displayed to a user. In the illustrated embodiment, the area identification module 134 forms the closed outline 194' such that the outline 194' is composed of as few straight lines as possible. As noted above, curves and rounded edges may be reproduced within the system as a series of straight lines. However, in other constructions, the area identification module 134 may form closed outlines according to other mechanisms.

The area identification module 134 proceeds to identify notations that form potential protrusions by determining which notations extend at an angle from the closed outline 194' (block 304). The area identification module 134 identifies the first notation 198 extending at an angle from the first connecting line 200 and forming the first potential protrusion 202, and the swing line 195 forming the second potential protrusion 203. In the illustrated embodiment of FIG. 10, the area identification module 134 also identifies the second notation 204 and the third notation 206. The second notation 204 extends at an angle from the second connecting line 208 and the third notation 206 extends at an angle from the third connecting line 210. Together, the second notation 204 and the third notation 206 form a third potential protrusion 212.

Figure 9:
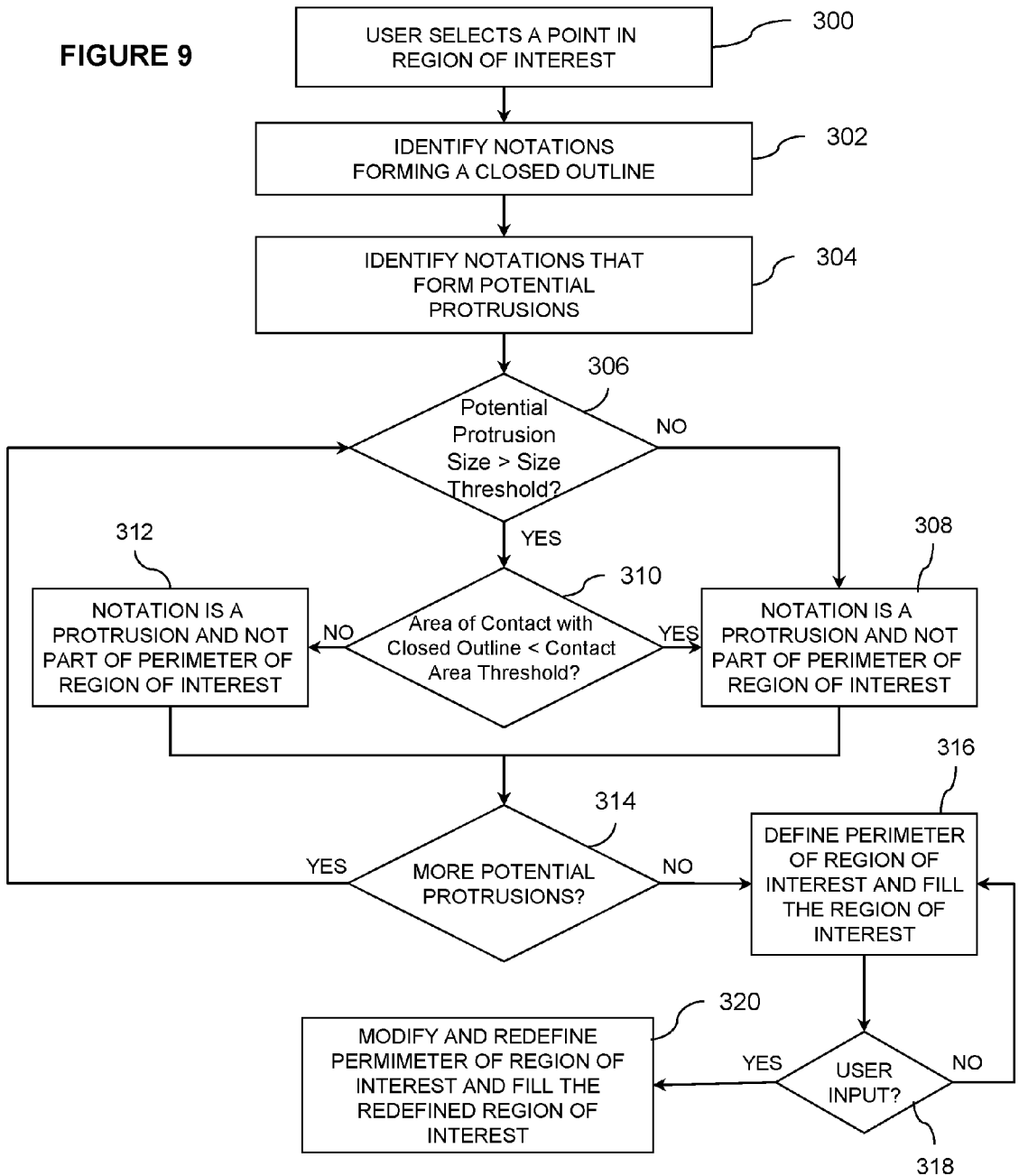
FIG. 9 is a flowchart illustrating an alternative method of defining the perimeter of the region of interest.
Figure 10:
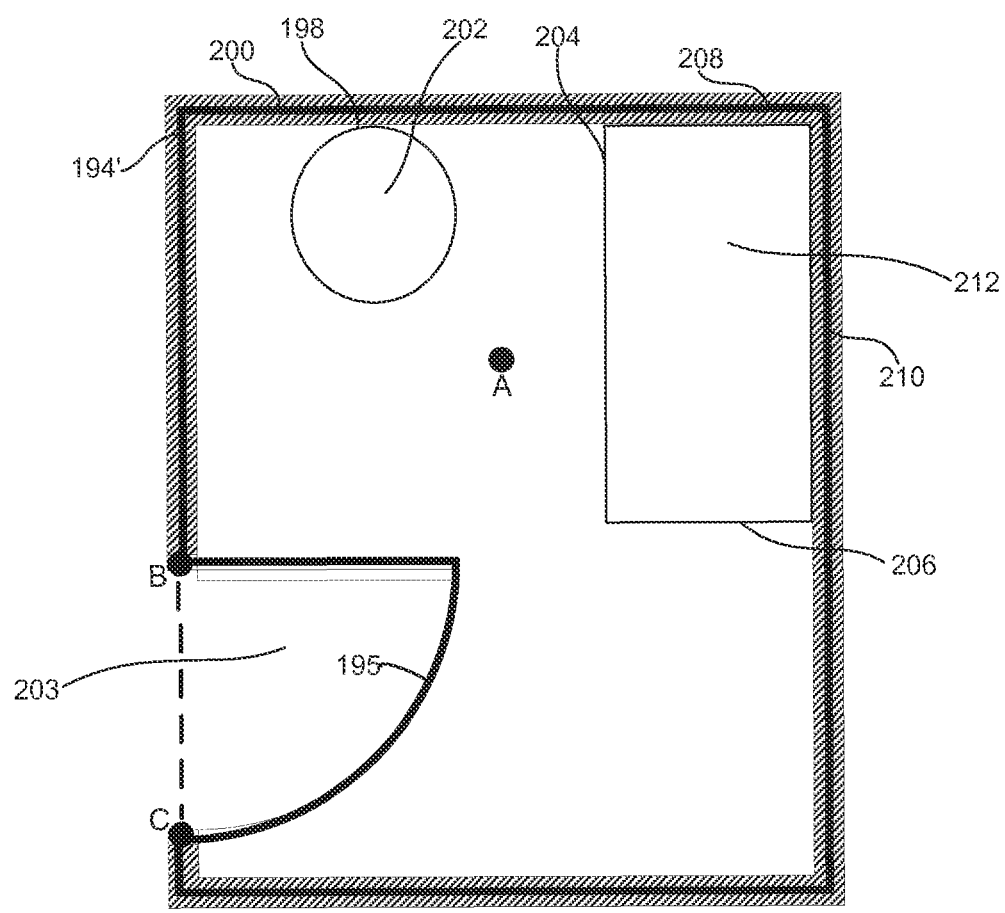
FIG. 10 is a partial view of the construction floor plan of FIG. 2 with a closed outline identified in response to a user input according to the method of FIG. 9.

As shown in FIG. 9, the area identification module 134 then determines whether the notations identified as potential protrusions (e.g., first notation 198, swing line 195, second notation 204, and third notation 206) represent a protrusion or a boundary of the region of interest. In the embodiment illustrated by FIG. 9, each identified potential protrusion (e.g., potential protrusions 202, 203, 212) is evaluated based on a size threshold and a contact area threshold to determine if the identified notation is a boundary and, therefore, part of the perimeter of the region of interest, or if, on the other hand, the identified notation forms a protrusion indicative of a fixture, furniture, a building structure, shrubbery, electrical wiring, annotations, a project legend, and/or symbols within the region of interest (blocks 306-312). In some embodiments, the size threshold and/or the contact area threshold are based on a pixel size. In other embodiments, the size threshold and/or the contact area threshold are based on metric or English units of measurement.

According to the method of FIG. 9, the area identification module 134 computes the area of each potential protrusion and compares the area of the potential protrusion to the size threshold (block 306). If the area of the potential protrusion is less than the size threshold, the notation is determined to be a protrusion and therefore, not a part of the perimeter of the region of interest (block 308). If the area of a potential protrusion exceeds the size threshold, the protrusion is then evaluated based on the contact area threshold (block 310).

The area identification module 134 determines an area of contact between the potential protrusion and the closed outline of the region of interest. In other words, the area identification module 134 determines the overlap between the potential protrusion and the extrapolation of the connecting lines from which the potential protrusion extends (e.g., the connecting lines 200, 208, 210). The area identification module 134 then compares the area of contact to the contact area threshold (block 310). If the area of contact between the protrusion and the closed outline is less than the area contact threshold, the notation is determined to be indicative of a protrusion and, therefore, not a part of the perimeter of the region of interest (block 308). If the area of contact between the protrusion and the closed outline exceeds the area contact threshold, the notation is determined to be indicative of a boundary and part of the perimeter of the region of interest (block 312). The area identification module 134 then determines if there are other notations potentially indicative of protrusions (e.g., more potential protrusions) within the region of interest in the construction document 132 (block 314). If there is more than one potential protrusion, the room identification module 134 evaluates the next potential protrusion according to the size threshold and the area contact threshold as described above (blocks 306-312).

Referring to FIG. 10, the area identification module 134 evaluates the area enclosed by the first notation 198 (e.g., the area of the first potential protrusion 202) based on the size threshold. In the illustrated embodiment, and only for the purpose of providing a representative example, the size threshold is 6 units and the area enclosed by the first notation 198 is 4 units. Therefore, in the illustrated embodiment, the first notation 198 is determined to be indicative of a protrusion because the area enclosed by the first notation 198 (e.g., the first potential protrusion 202) does not exceed the area threshold.

In the illustrated embodiment, the area identification module 134 then evaluates the swing line 195 as a notation potentially indicative of a protrusion. The area identification module 134 recognizes that one end of the swing line 195 (e.g., point B in FIG. 5) can be connected with a straight line to the opposite end of the swing line 195 (e.g., point C in FIG. 5). The area identification module 134 then determines the area encompassed by the swing line 195 and the straight line as the area of the second potential protrusion 203. In the illustrated embodiment, the area of the second potential protrusion 203 associated with the swing line 195 is, for example, 10 units. Therefore, in the illustrated example, the second potential protrusion 203 exceeds (i.e., is above, is greater than) the size threshold and is then evaluated with respect to the contact area threshold. The connecting line (e.g., line connecting points B and C shown in FIG. 5) is used to determine the contact area of the swing line to the closed outline 194'. In the illustrated embodiment, the contact area for the second potential protrusion is 4 units. Therefore, the swing line 195 is determined to be indicative of a boundary because the second potential protrusion exceeded the size threshold and the contact area threshold. Therefore, the swing line 195 is considered to be part of the perimeter of the region of interest. In other embodiments, the area identification module 134 does not evaluate the swing line 195 as a notation potentially indicative of a protrusion because there is no drawn connecting straight line. In such embodiments, the swing line 195 is then assumed to be part of the perimeter of the region of interest until the straight connecting line is drawn, for example, by a user.

The area identification module 134 then proceeds to evaluate the third potential protrusion 212 formed by the second notation 204 and the third notation 206. The area identification module 134 evaluates the area enclosed by the second notation 204 and the third notation 206 (e.g., the second potential protrusion 212) based on the size threshold. In the illustrated embodiment, and only for the purpose of providing a representative example, the area enclosed by the second notation 204 and the third notation 206 is 15 units. Therefore, the second potential protrusion 212 exceeds the size threshold and is then evaluated based on the contact area threshold. For purposes of providing a representative example, the contact area threshold for the illustrated embodiment is 3 units and the contact area between the second potential protrusion 212 and the closed outline 194' is 5 units. Since the contact area between the second potential protrusion 212 and the closed outline 194' exceeds the contact area threshold and the size of the potential protrusion exceeds the size threshold, the second notation 204 and the third notation 206 are determined to be indicative of boundaries and part of the perimeter of the region of interest.

Note that as illustrated in FIGS. 3 and 9, when any notations potentially indicative of protrusions are identified within the region of interest, but do not overlap or contact the closed outline 194, 194' (e.g., are islands within the region of interest), the area identification module 134 automatically disregards the notations and determines that the notations are indicative of protrusions and not part of the perimeter of the region of interest. For example, in FIG. 2, potential protrusions 214a-k are located within a region of interest (e.g., the dining room). The potential protrusions 214a-k do not contact or touch any closed outlines. Rather, the potential protrusions 214a-k are located in the middle of a room. As such, the area identification module 134 determines that the potential protrusions represent actual protrusions and not boundaries.

Once all the identified protrusions are evaluated and determined either to be a boundary and part of the perimeter of the region of interest or a protrusion and not part of the perimeter of the region of interest, the area identification module 134 defines the perimeter of the region of interest based on the notations that were determined to be indicative of boundaries (block 316). The automatically defined perimeter 216 of the region of interest is then displayed to a user. The architecture system 100 shows the user what the area identification module 134 has defined as the region of interest by filling with a shade of color, or a filling pattern (see FIG. 5), the area defined by the region of interest (block 316). The user is then able to verify that the region of interest as defined by the area identification module 134 is indeed the desired region of interest.

For example, as shown in FIG. 5, the area identification module 134 displays the identified region of interest by filling the region of interest with a filling pattern and displaying an outline showing the automatically defined perimeter 216. According to FIG. 5, and as explained above, the first notation 198 forms a protrusion and does not form part of the perimeter of the region of interest, while the swing line 195, the second notation 204, the third notation 206, are indicative of boundaries and form part of the perimeter of the region of interest.

After the area identification module 134 displays the automatically defined perimeter 216 to the user (FIG. 5), the area identification module 134 monitors for any received user input to modify the perimeter of the region of interest (block 318). Similar to the method of FIG. 3, if the area identification module 134 receives any user input to modify the perimeter of the region of interest, the area identification module 134 modifies the perimeter of the region of interest and fills with a shade of color or filling pattern the region of interest as redefined by the user (block 320).

When implementing the method of FIG. 9, the area identification module 134 can also receive similar user inputs to those described with respect to the method of FIG. 3. In particular, the area identification module 134 can determine if the connecting line between points B and C is drawn by a user and include the connecting line as part of the first modified perimeter 218 (see FIG. 6). The area identification module 134, when implementing the method of FIG. 9, can also merge two regions by clicking on the point D within a different enclosed area (see FIG. 7). Clicking on point D defines the second modified perimeter 220 shown in FIG. 8. Therefore, even if the automatically defined perimeter 216 is not exactly correct (e.g., does not correspond to the true dimensions of a particular room), modifying the perimeter is fast and straightforward.

Figure 11:
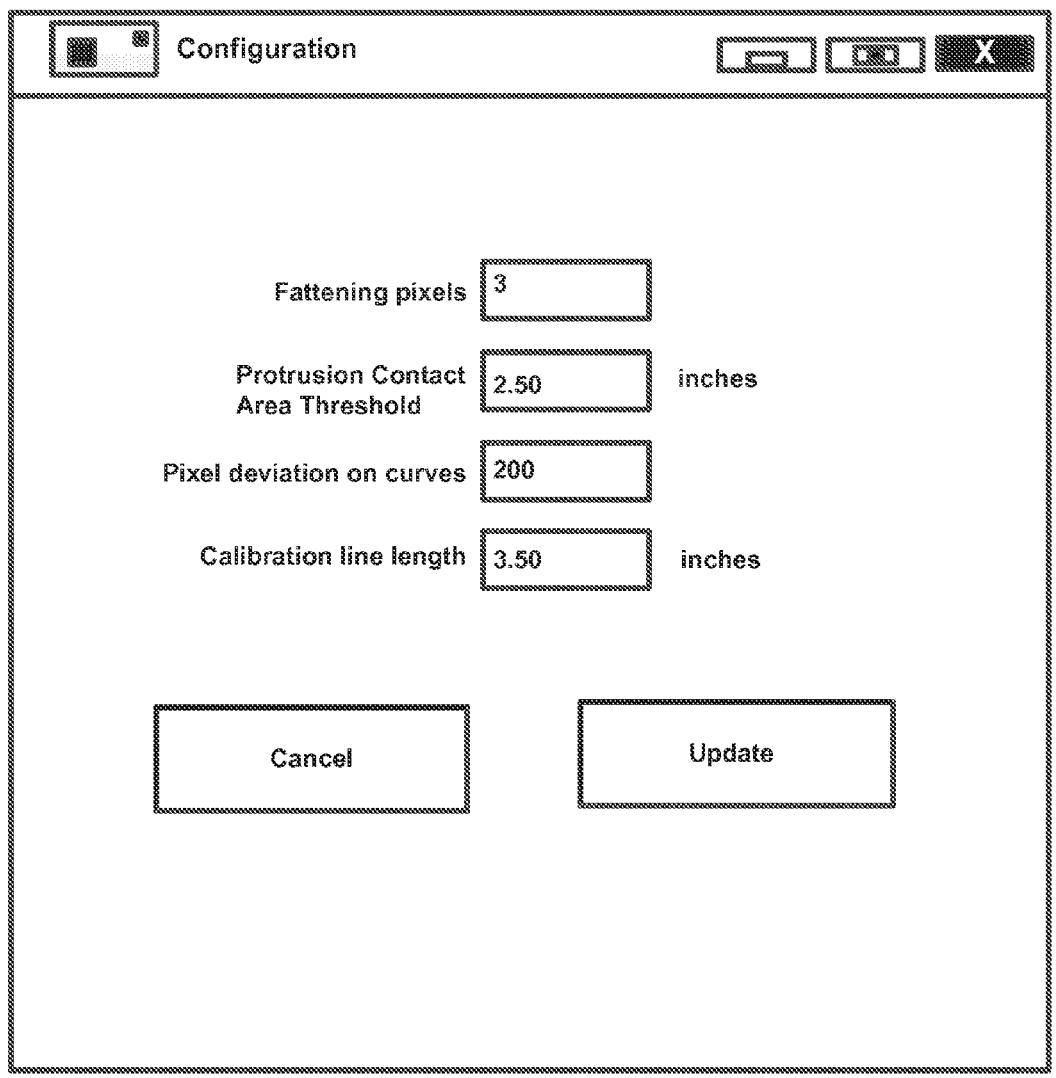
FIG. 11 is a user interface for an area identification module of the architectural system of FIG. 1 showing various user adjustable settings.

As illustrated in FIG. 11, the area identification module 134 includes different settings that may be configured by a user. For example, the area identification module 134 may allow a user to change the fattening pixels, the protrusion contact area threshold, a pixel deviation on curves, and a calibration line length. The pixel deviation on curves refers to how accurately the area identification module 134 follows the curves on the construction documents. For example, the higher the pixel deviation on curves, the less accurately the area identification module 134 follows the curve of, for example, a door swing line. A lower pixel deviation on curves may allow the area identification module to follow the curve of, for example, the door swing line more accurately. Fattening pixels refer to the capability of the architectural system 100 to turn dotted, dashed, or half-toned lines into solid lines. The area identification module 134 may, in some embodiments, also allow a user to set the number of thinning pixels, which are indicative of the capability of the architectural system 100 to delete thin lines. In some embodiments, the ratio threshold may also be changed by a user. For example, the user may select the ratio threshold from a variety of different ratio thresholds (e.g., a low ratio threshold like 1 unit, a medium ratio threshold like 3 units, and a large ratio threshold like 7 units). In other embodiments, the user may input a ratio of his/her choosing.

The area identification module 134 can also group several regions of interest together and define an aggregate perimeter by using a click and drag technique. For example, if the construction document 132 includes three different rooms positioned next to each other, a user may click on the first room, and hold and drag a mouse of the local computer 120 to select the adjacent rooms. The area identification module 134 will then calculate the area of the three rooms, rather than just one room. The click and drag technique can also be used to calculate, for example, dimensions of a stairwell or exterior surface materials (e.g., bricks, vinyl, stucco, and other similar materials on a side of a home).

Once the user has verified that the correct perimeter is defined for the region of interest, the user selects a quantity to be calculated by the calculation module 138. In one embodiment, the user selects a particular quantity from a plurality of possible quantities from a drop down menu. The calculation module 138 has access to a plurality of equations, to calculate for example the area of the region of interest, perimeter of the region of interest, corner count, and a plurality of other information related to the construction of the region of interest. For example, the calculation module 138 may calculate the number of corners (e.g., corner count or point count) in the perimeter of the region of interest and use the corner count, for example, in determining the number of corner studs or corner beads for drywall needed to build the region of interest. The point count (i.e., corner count) may determine the number of corners based on user input. For example, each time a user clicks on a corner, the calculation module 138 may determine that a corner has been clicked. When the user is then done clicking around the region of interest, the calculation module 138 may add all the points and output a total corner/point count. In other examples, the calculation module 138 may determine the corner count automatically, without having the user click on each corner. The calculation module 138 may determine that a specific point is a corner based on the angle between two intersecting lines.

In another example, a user may request to know the cost of installing one foot by one foot tiles on the floor of the region of interest. The calculation module 138 may first determine the area of the region of interest that would need to be covered in tiles. The calculation module 138 may then receive cost information associated with the floor tiles via, for example, user input. The calculation module 138 may additionally or alternatively have access to typical costs for one-foot tiles as well as typical labor costs for covering the floor of the region of interest with such tiles. In one embodiment, the calculation module 138 has access to an external database server that stores equations and other information to aid the calculation module 138. In other embodiments, the calculation module 138 includes a memory module that stores the necessary information. In yet another embodiment, the database server 108 stores the equations and information necessary for the calculation module 138.

The export module 142 creates a separate document to store the calculations and results from the calculation module 138. In the illustrated embodiment, the export module 142 creates a spreadsheet document that is easily manipulated by a user to obtain additional information regarding the region of interest. For example, the export module 142 may export the calculated area of the region of interest, the number of one-foot tiles necessary to cover the floor of the region of interest, and the cost of each tile, and the total material cost for installing one-foot tiles on the region of interest. A user can then modify the cost of each tile, if a particular tile is more or less costly than the amount estimated by the calculation module 138. The export module 142 may also create a text document showing the calculations from the calculation module 138, or the export module 142 may create any other type of document to store and display the calculations from the calculation module 138.

Thus, the invention provides, among other things, systems and methods for automatically defining the perimeter of a region of interest in a floor plan document. Various features and advantages of the invention are set forth in the following claims.

What is claimed is:

1. A method of defining a region of interest in a construction document, the method comprising:
   accessing a stored construction document from a non-transient computer-readable memory, the construction document including a graphical representation of structures included in a building plan;
   displaying at least a portion of the construction document on a display;
   receiving an input from a user, the input identifying a point within the region of interest;
   defining a perimeter of the region of interest by identifying a boundary of the region of interest;
   identifying one or more notations along the boundary, wherein the one or more notations are protrusions from the boundary and include information about structures in the construction document;
   determining whether the one or more notations (i) represents part of the perimeter of the region of interest, or (ii) represents a protrusion that is not part of the perimeter;
   wherein determining whether a first notation from the one or more notations represents part of the perimeter of the region of interest includes
      determining a contour distance associated with the first notation, wherein the contour distance includes a distance of a line forming an outer boundary of the first notation;
      determining a straight line distance associated with the first notation, wherein the straight line distance is a distance of a line connecting two points along the boundary of the region of interest that removes the first notation from the boundary; and
      determining a ratio of the contour distance to the straight line distance, wherein the first notation is determined to be part of the perimeter or not part of the perimeter based on the ratio;
   adjusting the perimeter of the region of interest by including the notations determined to be part of the perimeter of the region of interest and by bypassing the protrusion that is not part of the perimeter to omit the protrusion from the perimeter; and
   calculating, by a processor, a quantity associated with the region of interest based on the adjusted perimeter of the region of interest.

2. The method of claim 1, further comprising receiving an input from a user to modify the defined perimeter of the region of interest.

3. The method of claim 2, wherein receiving an input from a user to modify the defined perimeter of the region of interest includes connecting, with a straight line, two notations indicative of boundaries of the region of interest to form a closed outline around the identified point.

4. The method of claim 2, wherein receiving an input from a user to modify the defined perimeter of the region of interest includes receiving a selection of a point in an area adjacent the identified perimeter.

5. The method of claim 1, wherein defining the perimeter of the region of interest to identify the boundary includes identifying a closed outline near the identified point.

6. The method of claim 5, wherein defining the perimeter to identify the boundary further includes identifying a plurality of uniform contours forming at least part of the closed outline near the identified point.

7. The method of claim 1, wherein identifying one or more notations that represent the protrusion includes identifying one or more notations extending at an angle from a straight line from the perimeter.

8. The method of claim 1, wherein determining whether the one or more notations are part of the perimeter of the region of interest includes comparing an area bounded by the one or more notations to a size threshold.

9. The method of claim 8, wherein determining whether the one or more notations are part of the perimeter of the region of interest includes, for a first notation from the one or more notations:
   determining, based on the shape and the location of the first notation in the construction document, an area of contact between the first notation and the boundary of the region of interest; and comparing the determined area of contact to a contact threshold.

10. The method of claim 9, wherein determining whether the one or more notations are part of the perimeter of the region of interest includes
determining that the first notation is part of the perimeter of the region of interest when an area bounded by the first notation exceeds a size threshold and the determined area of contact exceeds the contact threshold.

11. The method of claim 1, wherein determining whether the first notation is part of the perimeter of the region of interest includes
comparing the ratio of the contour distance to the straight line distance associated with the first notation to a ratio threshold, and
determining that the first notation is part of the perimeter of the region of interest when the ratio of the contour distance to the straight line distance associated with the at least one potential protrusion is below the ratio threshold.

12. The method of claim 1, wherein calculating a quantity associated with the region of interest based on the adjusted perimeter of the region of interest includes calculating an area of the region of interest, a linear perimeter of the region of interest, a total material count associated with the region of interest, or a total cost associated with the region of interest.

13. The method of claim 1, wherein the construction document includes more than one region of interest.

14. A method of defining a region of interest in a construction document, method comprising:
accessing a stored floor plan document from a non-transient computer-readable memory, the construction document including a graphical representation of structures included in a building plan;
displaying at least a portion of the construction document on a display;
receiving an input from a user, the input identifying a point within the region of interest;
identifying a closed outline in the construction document surrounding the identified point within the region of interest;
identifying a plurality of uniform contours each forming at least part of the closed outline, each uniform contour being potentially indicative of a boundary in the construction document;
identifying a potential protrusion, the potential protrusion forming a part of the closed outline in the construction document;
determining whether the potential protrusion forms part of a perimeter of the region of interest by
determining a contour distance associated with the potential protrusion, wherein the contour distance includes a distance of a line forming an outer boundary of the potential protrusion;
determining a straight line distance associated with the potential protrusion, wherein the straight line distance is a distance of a line connecting two points along the closed outline of the region of interest that removes the potential protrusion from the closed outline; and
determining a ratio of the contour distance to the straight line distance associated with the at least one potential protrusion, wherein the potential protrusion is determined to be part of the perimeter or not part of the perimeter based on the ratio;
defining the perimeter of the region of interest,
wherein the perimeter of the region of interest includes the uniform contour and omits the identified potential protrusion when it is determined that the potential protrusion does not form part of the perimeter of the region of interest, and
wherein the perimeter of the region of interest includes the potential protrusion and only part of the uniform contours included in the closed outline when it is determined that the potential protrusion forms part of the perimeter of the region of interest.

15. The method of claim 14, wherein determining whether the potential protrusion forms part of a perimeter of the region of interest includes determining whether the potential protrusion forms part of the perimeter of the region of interest based on at least one criteria selected from a group consisting of a size, shape, and location of the potential protrusion.

16. The method of claim 14, wherein determining that the potential protrusion forms part of the perimeter of the region of interest based on at least one criteria selected from a group consisting of a size, shape, and location of the potential protrusion includes comparing an area of the potential protrusion to a size threshold.

17. The method of claim 14, wherein determining that the potential protrusion forms part of the perimeter of the region of interest based on at least one criteria selected from a group consisting of a size, shape, and location of the potential protrusion also includes determining, based on the shape and location of the potential protrusion, an area of contact between the potential protrusion and one of the uniform contours forming at least part of the closed boundary surrounding the identified point, and comparing the area of contact with a contact threshold.

18. The method of claim 17, wherein determining that the potential protrusion forms part of the perimeter of the region of interest based on at least one criteria selected from a group consisting of a size, shape, and location of the potential protrusion also includes determining that the potential protrusion forms part of the perimeter of the region of interest if at least one of the group consisting of the area of the potential protrusion exceeds the size threshold and the area of contact exceeds the contact threshold.

19. The method of claim 14, wherein a protrusion is one of the group consisting of a fixture, a door, a window, a piece of furniture, a building structure, shrubbery, electrical wiring, annotations, project legend and symbols.

20. The method of claim 14, wherein determining whether the potential protrusion is part of the perimeter of the region of interest includes
comparing the ratio of the contour distance to the straight line distance associated with the potential protrusion to a ratio threshold, and
determining that the potential protrusion is part of the perimeter of the region of interest when the ratio of the contour distance to the straight line distance associated with the potential protrusion exceeds the ratio threshold.

21. The method of claim 14, further comprising receiving an input from a user to modify the defined perimeter of the region of interest.

22. The method of claim 14, further comprising calculating, based on the defined perimeter of the region of interest, a quantity associated with the region of interest.

23. The method of claim 22, wherein the quantity associated with the region of interest is one of the group consisting of a linear perimeter of the region of interest, an area of the region of interest, a material count associated with the region of interest, and a cost associated with the region of interest.

* * * * *